(12) United States Patent
Hellwig et al.

(10) Patent No.: US 8,911,888 B2
(45) Date of Patent: Dec. 16, 2014

(54) THREE-DIMENSIONAL MAGNETIC MEMORY WITH MULTI-LAYER DATA STORAGE LAYERS

(75) Inventors: Olav Hellwig, San Jose, CA (US); Bruce D. Terris, Sunnyvale, CA (US); Jan-Ulrich Thiele, Sunnyvale, CA (US)

(73) Assignee: HGST Netherlands B.V., Amsterdam (NL)

( * ) Notice: Subject to any disclaimer, the term of this patent is extended or adjusted under 35 U.S.C. 154(b) by 1962 days.

(21) Appl. No.: 11/957,476

(22) Filed: Dec. 16, 2007

(65) Prior Publication Data

US 2009/0154219 A1 Jun. 18, 2009

(51) Int. Cl.
G11B 5/39 (2006.01)
H01L 27/22 (2006.01)
G11C 11/16 (2006.01)

(52) U.S. Cl.
CPC ............. *G11C 11/16* (2013.01); *H01L 27/222* (2013.01)
USPC ........ 428/811.3; 365/173; 365/158; 365/171; 428/811; 428/811.1; 428/811.2

(58) Field of Classification Search
USPC ........... 428/811, 812, 815, 816, 811.1, 811.2, 428/692.1, 693.1; 365/158, 171, 173
See application file for complete search history.

(56) References Cited

U.S. PATENT DOCUMENTS

| | | | |
|---|---|---|---|
| 3,573,760 | A | 4/1971 | Chang et al. |
| 3,696,349 | A | 10/1972 | Kaske et al. |
| 4,791,604 | A | 12/1988 | Lienau et al. |
| 5,237,529 | A | 8/1993 | Spitzer |
| 6,185,122 | B1 | 2/2001 | Johnson et al. |
| 6,834,026 | B2 | 12/2004 | Fullerton et al. |
| 6,925,000 | B2 | 8/2005 | Sussner |
| 6,980,468 | B1 | 12/2005 | Ounadjela |

(Continued)

FOREIGN PATENT DOCUMENTS

| | | |
|---|---|---|
| JP | 53124930 | 10/1978 |
| JP | 5135568 | 6/1993 |

(Continued)

OTHER PUBLICATIONS

Wang, J, et al., "Low-Current Blocking Temperature Writing of Double Barrier Magnetic Random Access Memory Cells", Applied Physics Letters, vol. 84, No. 6, pp. 945-947 (Feb. 2004).
Cardoso, S. et al., "Double-Barrier Megnetic Tunnel Junctions With GeSbTe Thermal Barriers for Improved Thermally Assisted Magnetoresistive Random", Journal of Applied Physics 99, 08N901 (2006).

*Primary Examiner* — Holly Rickman
*Assistant Examiner* — Lisa Chau
(74) *Attorney, Agent, or Firm* — Duft Bornsen & Fettig LLP

(57) ABSTRACT

Magnetic memories and methods are disclosed. A magnetic memory as described herein includes a plurality of stacked data storage layers to form a three-dimensional magnetic memory. The data storage layers are each formed from a multi-layer structure. At ambient temperatures, the multi-layer structures exhibit an antiparallel coupling state with a near zero net magnetic moment. At higher transition temperatures, the multi-layer structures transition from the antiparallel coupling state to a parallel coupling state with a net magnetic moment. At yet higher temperatures, the multi-layer structure transitions from the antiparallel coupling state to a receiving state where the coercivity of the multi-layer structures drops below a particular level so that magnetic fields from write elements or neighboring data storage layers may imprint data into the data storage layer.

17 Claims, 15 Drawing Sheets

(56) References Cited

U.S. PATENT DOCUMENTS

| | | |
|---|---|---|
| 6,982,894 B2 | 1/2006 | Mercaldi |
| 2004/0012056 A1* | 1/2004 | Nejad et al. ............... 257/414 |
| 2004/0170055 A1* | 9/2004 | Albert et al. ............... 365/173 |
| 2004/0233746 A1 | 11/2004 | Kumar et al. |
| 2005/0128794 A1* | 6/2005 | Sussner ..................... 365/158 |
| 2005/0174821 A1 | 8/2005 | Zheng et al. |
| 2005/0281081 A1 | 12/2005 | Fullerton et al. |
| 2006/0188752 A1 | 8/2006 | Gusliyenko |

FOREIGN PATENT DOCUMENTS

| | | |
|---|---|---|
| JP | 2000285668 | 10/2000 |
| JP | 2003092440 | 3/2003 |
| WO | WO8700959 | 2/1987 |
| WO | WO2004032115 | 4/2004 |

\* cited by examiner

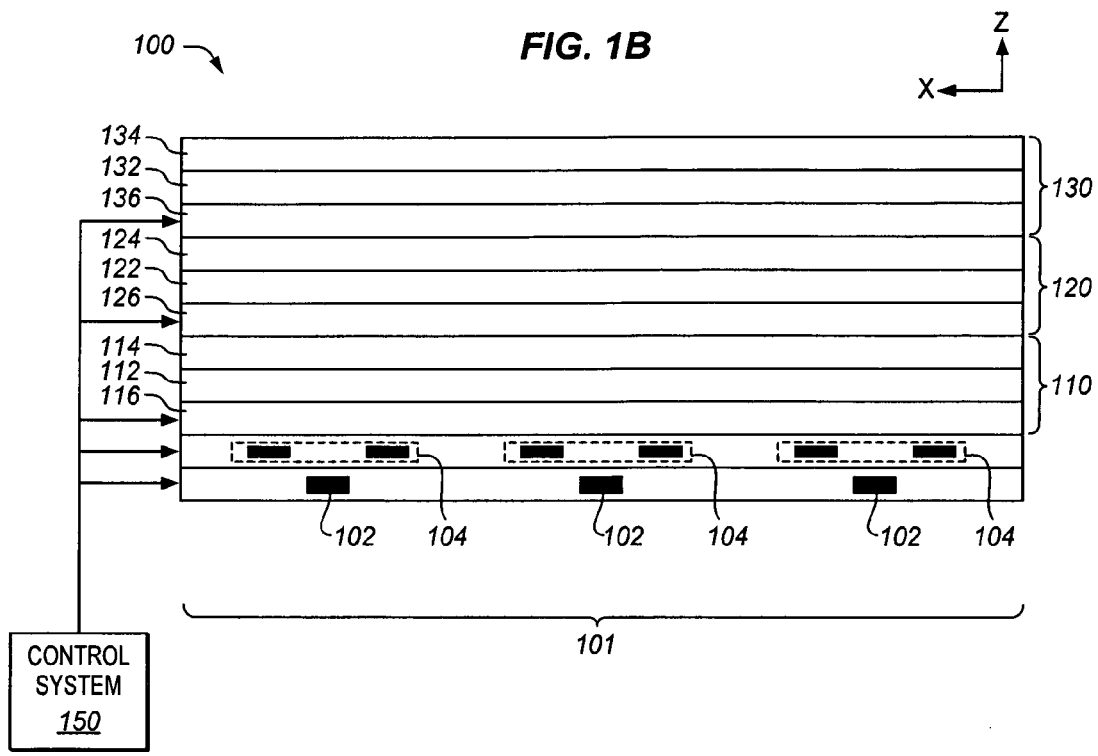
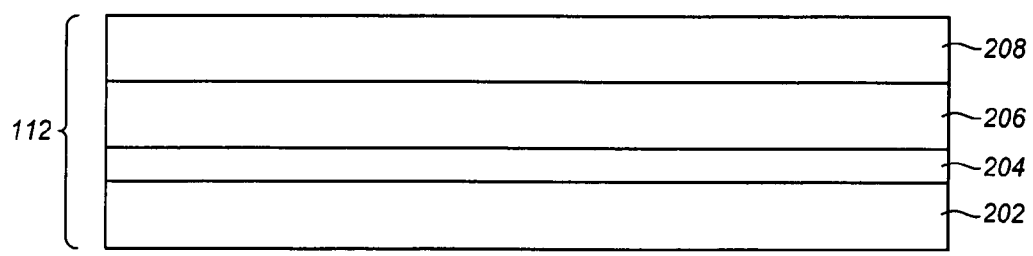

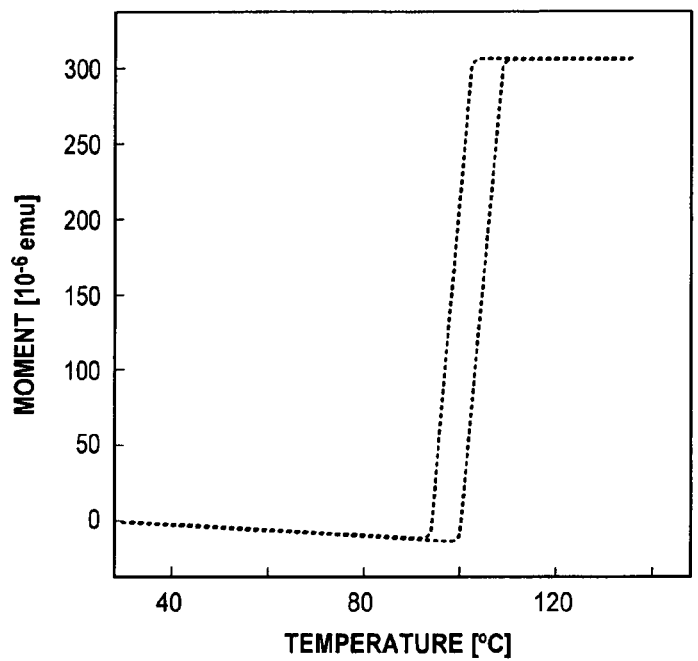
FIG. 5
FIG. 6
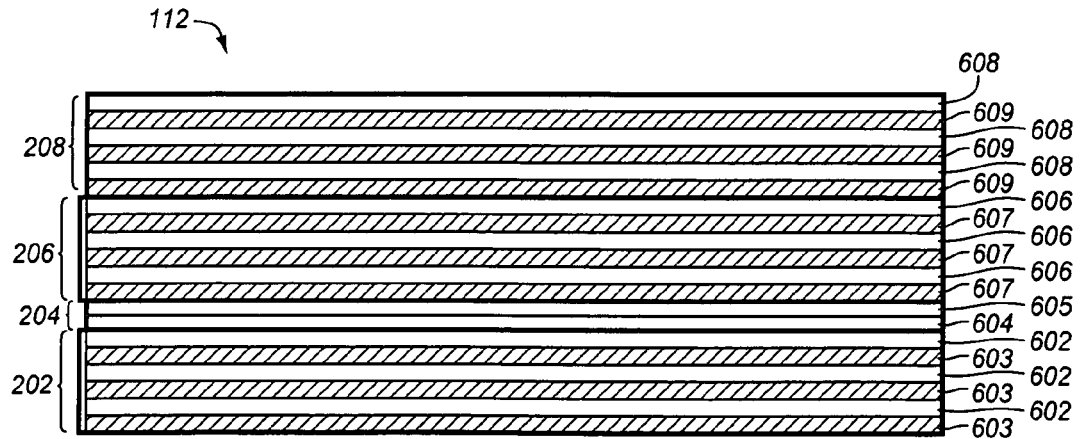

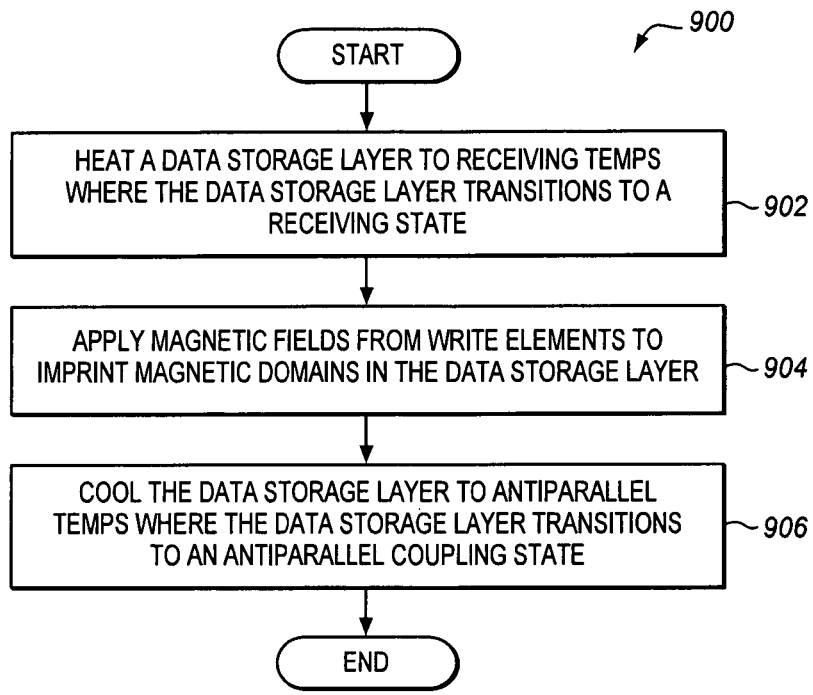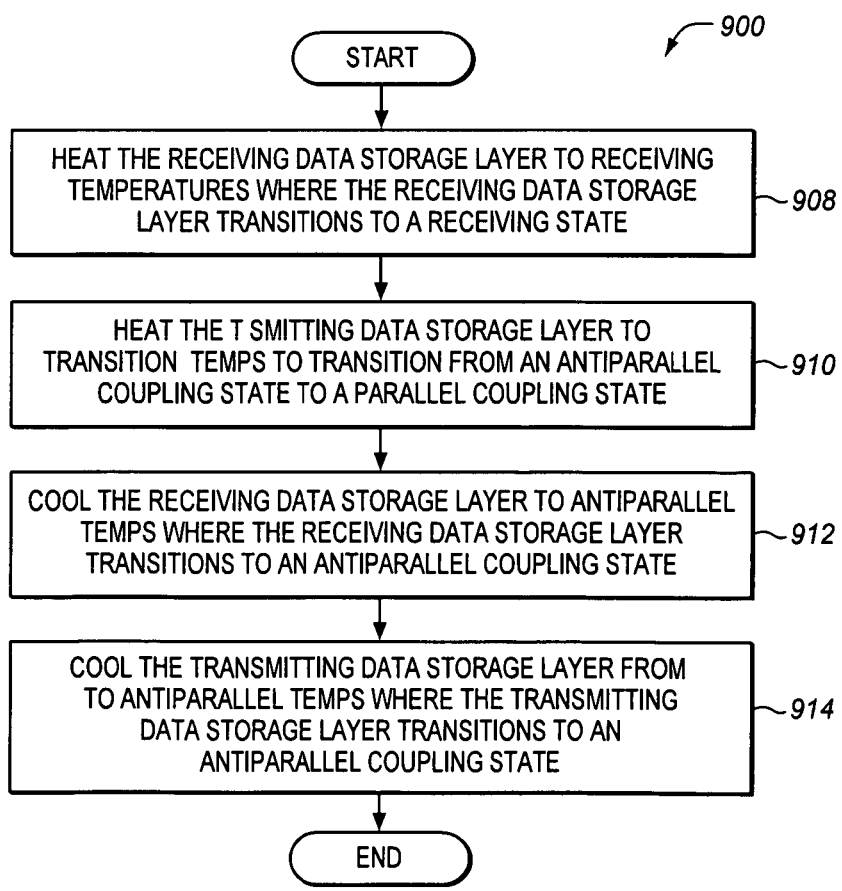

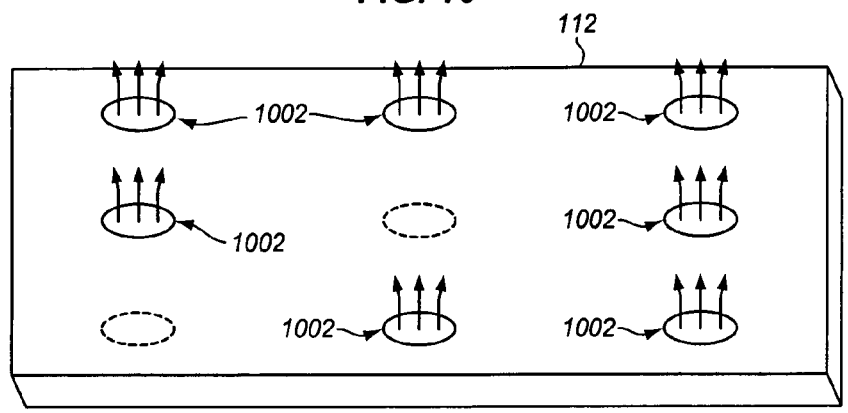
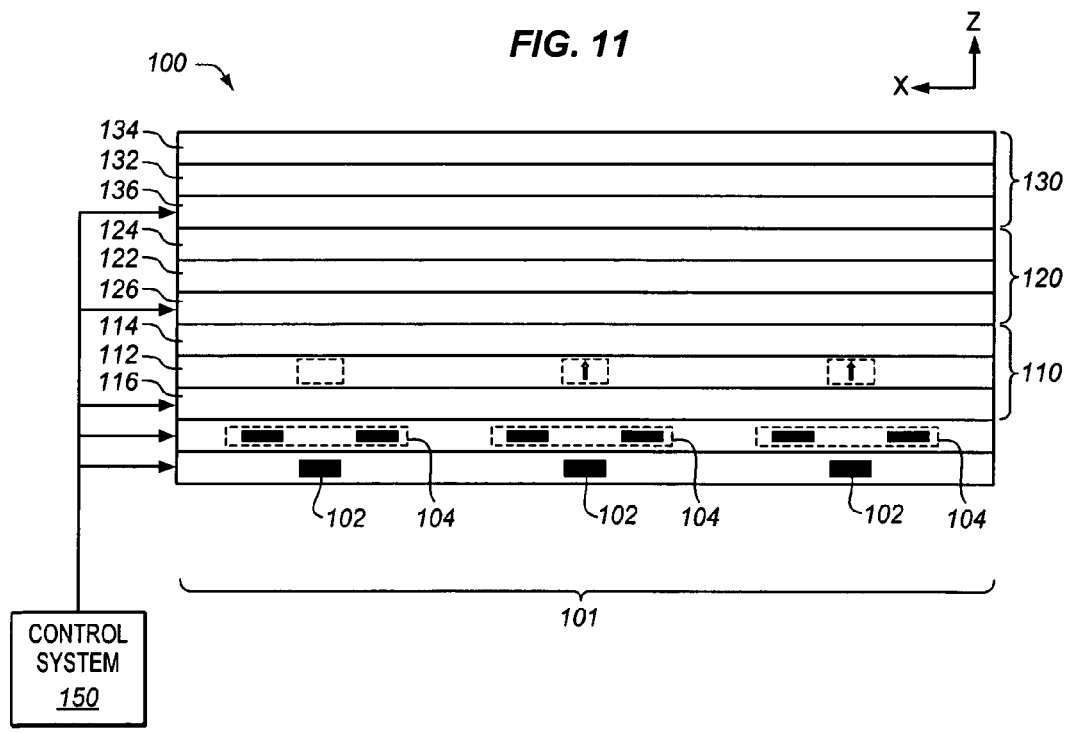

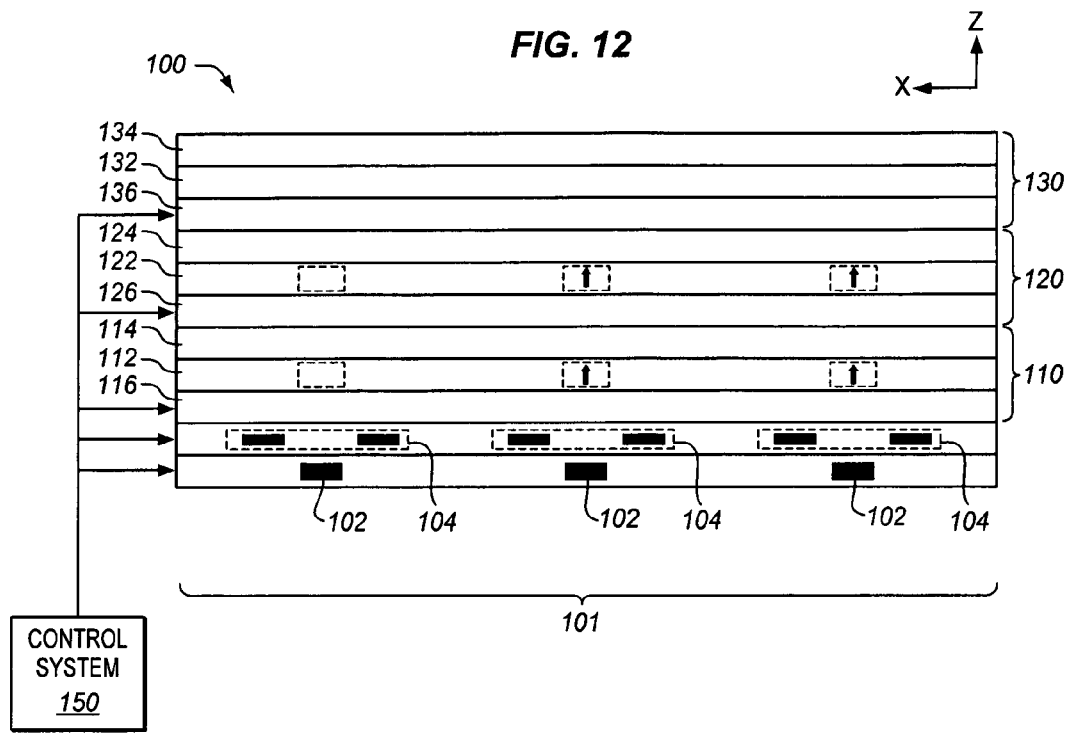
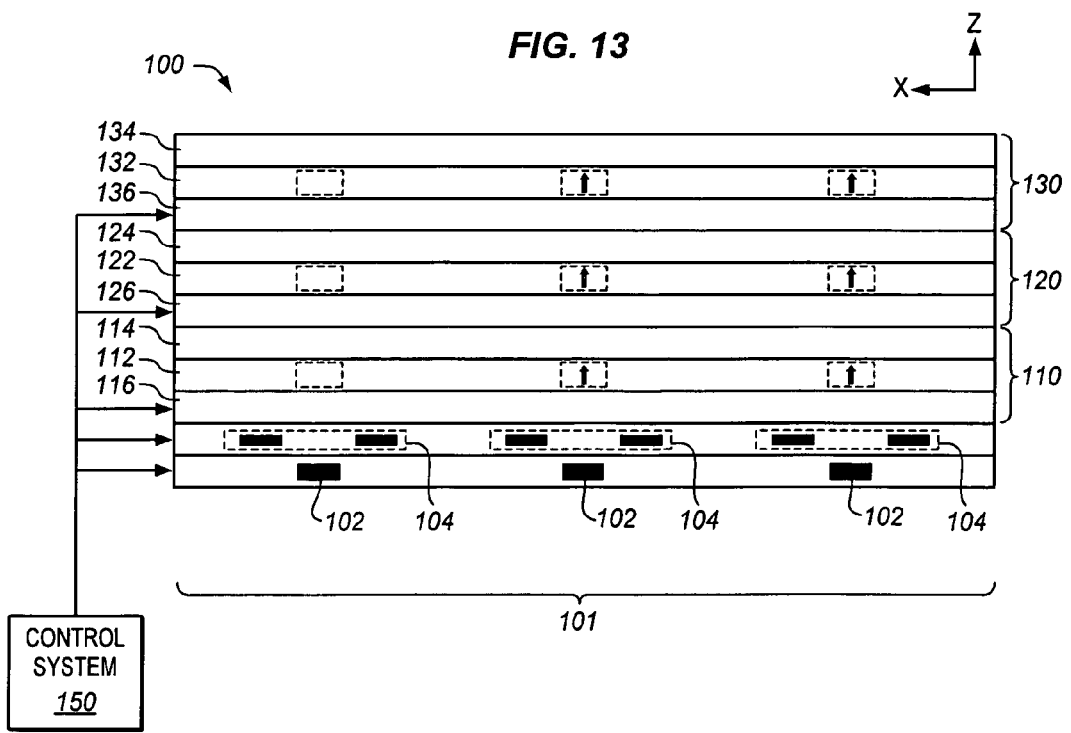

THREE-DIMENSIONAL MAGNETIC MEMORY WITH MULTI-LAYER DATA STORAGE LAYERS

RELATED APPLICATIONS

This patent application relates to a U.S. patent application having the Ser. No. 11/615,618 that was filed on Dec. 22, 2006, which is incorporated herein by reference.

BACKGROUND OF THE INVENTION

1. Field of the Invention

The invention is related to the field of memories and, in particular, to a three-dimensional magnetic memory comprised of a stack of data storage layers. More particularly, the data storage layers of the three-dimensional magnetic memory are formed from multi-layer structures.

2. Statement of the Problem

Solid-state memory is a nonvolatile storage medium that uses no moving parts. Some examples of solid-state memory are flash memory and MRAM (magnetoresistive random access memory). Solid-state memories provide advantages over conventional disk drives in that data transfers to and from solid-state memories take place at a much higher speed than is possible with electromechanical disk drives. Solid-state memories may also have a longer operating life and may be more durable due to the lack of moving parts. One problem with traditional solid-state memories is that storage capacity is much less than can be achieved with electromechanical disk drives. For instance, a common flash memory may store up to approximately 1 gigabyte (GB), whereas a common hard drive may store up to 100 GB or more. The cost per megabyte is higher for solid-state memories than for electromechanical disk drives.

Solid-state memories have a size that is determined by a minimum feature size (F). One problem with solid-state magnetic memories (as opposed to flash memory) is the cell density of the memory. A typical solid-state magnetic memory has a cell size that is large compared to flash memories due to the nature of magnetic fields from current lines extending over a typical 4 F distance range. For instance, an MRAM may have a cell size of 32 $F^2$ while a flash memory may have a cell size of 4 $F^2$. The larger cell size of solid-state magnetic memories unfortunately relates to a reduced cell density.

It may thus be desirable to design solid-state magnetic memories that have reduced cell size.

SUMMARY OF THE SOLUTION

The invention solves the above and other related problems with a three-dimensional solid-state magnetic memory. The three-dimensional magnetic memory includes a plurality of stacked data storage layers where each data storage layer is adapted to store bits of data. The bits may be transferred between the data storage layers as desired. By using stacked data storage layers to form a three-dimensional magnetic memory, the net cell size is advantageously reduced which allows for increased cell density. For instance, assume a two-dimensional magnetic memory initially has a cell size of 16 $F^2$. If the magnetic memory is implemented with four stacked data storage layers as described herein instead of one data storage layer, then the effective cell size can be reduced to 4 $F^2$. If the magnetic memory is implemented with sixteen stacked data storage layers as described herein instead of one data storage layer, then the effective cell size can be reduced to 1 $F^2$. The three-dimensional magnetic memory as described herein advantageously competes with flash memories and disk drives in terms of cell density (or bit density).

One embodiment of the invention is a magnetic memory having stacked data storage layers. The magnetic memory includes a first storage stack including a first data storage layer defining a first plane. The stack is a sequence of thin films, deposited one on top of another, and forms a fundamental building block of the magnetic memory described herein. The magnetic memory further includes a plurality of secondary storage stacks, where the secondary storage stacks include second data storage layers defining secondary planes that are parallel to the first plane. The first plane and the secondary planes are in the X-Y direction, and the data storage layers are thus stacked in the Z direction.

The first data storage layer and the secondary data storage layers are each formed from a magnetic multi-layer structure having an antiparallel coupling between the constituent layers at ambient temperatures. For example, a data storage layer may include a first ferromagnetic layer, an antiparallel (AP) coupling layer, a second ferromagnetic layer, and a third ferromagnetic layer. The first ferromagnetic layer and the second ferromagnetic layer/third ferromagnetic layer are antiparallel coupled across the AP coupling layer at ambient temperatures, also referred to as an antiparallel temperature ($T_{AP}$). The thicknesses and magnetizations of the constituent layers can be tuned such that there is a zero (or near zero) net magnetic moment in the data storage layer at ambient temperature and low fields. By having the data storage layers in an antiparallel coupling state at $T_{AP}$, the data storage layers are not written to by magnetic stray fields of neighboring data storage layers. Similarly, the data storage layers have a net magnetic moment near zero, so they do not write to neighboring data storage layers. The data storage layers may thus be fabricated close to one another creating a higher density magnetic memory.

The first data storage layer and the secondary data storage layers are also each formed to transition from an antiparallel coupling state to a parallel coupling state at higher temperatures, which are referred to as a transition temperature ($T_T$). To accomplish this in one embodiment, the first ferromagnetic layer and the third ferromagnetic layer of a data storage layer have a Curie temperature that is higher than the Curie temperature of the second ferromagnetic layer. Thus, when the data storage layer is heated above the Curie temperature of the second ferromagnetic layer, the first ferromagnetic layer and the third ferromagnetic layer are no longer antiparallel coupled across the AP coupling layer and the second ferromagnetic layer. The first ferromagnetic layer and the third ferromagnetic layer transition to parallel coupling having a net magnetic moment. The net magnetic moment of the data storage layer may be used to write to other neighboring data storage layers. It may be noted that there is one naturally occurring class of materials, namely chemically ordered alloys of iron and rhodium (FeRh), that shows a very similar behavior. However, compared to the solution proposed herein these materials require prohibitively high processing temperatures to achieve the chemical ordering.

The first data storage layer and the secondary data storage layers are also each formed to transition from an antiparallel coupling state to a receiving state at even higher temperatures, which is referred to as a receiving temperature ($T_R$). The receiving temperature is close to the Curie temperatures of the first ferromagnetic layer and the third ferromagnetic layer of a data storage layer. When heated to the receiving temperature, the coercivity of the first ferromagnetic layer or the third ferromagnetic layer drops below the strength of external magnetic fields, such as from write elements or a neighboring data storage layer. Thus, the external magnetic fields imprint a plurality of magnetic domains in the first ferromagnetic layer or the third ferromagnetic layer. The magnetic domains represent a plurality of bits being stored in the data storage layer. With the magnetic domains imprinted in the first ferromagnetic layer or the third ferromagnetic layer, the data storage layer may be cooled back to the antiparallel temperature ($T_{AP}$), which transitions the data storage layer back to an antiparallel coupling state.

The invention may include other exemplary embodiments described below.

DESCRIPTION OF THE DRAWINGS

The same reference number represents the same element or same type of element on all drawings.

FIG. 1B is a cross-sectional view of a magnetic memory in an exemplary embodiment of the invention.

FIG. 2 is a cross-sectional view of a data storage layer in an exemplary embodiment of the invention.

FIG. 5 is a graph illustrating the magnetic moment of a data storage layer as a function of temperature in an exemplary embodiment of the invention.

FIG. 6 is another cross-sectional view of a data storage layer in an exemplary embodiment of the invention.

FIGS. 9A-9B are flow charts illustrating a method of writing bits to a magnetic memory in an exemplary embodiment of the invention.

FIG. 10 is an isometric view of a portion of a data storage layer illustrating bits written to the data storage layer in an exemplary embodiment of the invention.

FIG. 11 illustrates a magnetic memory with bits written into a first data storage layer in an exemplary embodiment of the invention.

FIG. 12 illustrates a magnetic memory with the bits copied from a first data storage layer to a second data storage layer in an exemplary embodiment of the invention.

FIG. 13 illustrates a magnetic memory with the bits copied from a second data storage layer to a third data storage layer in an exemplary embodiment of the invention.

DETAILED DESCRIPTION OF THE INVENTION

FIGS. 1-24 and the following description depict specific exemplary embodiments of the invention to teach those skilled in the art how to make and use the embodiments. For the purpose of teaching inventive principles, some conventional aspects of the embodiments have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Figure 1A:
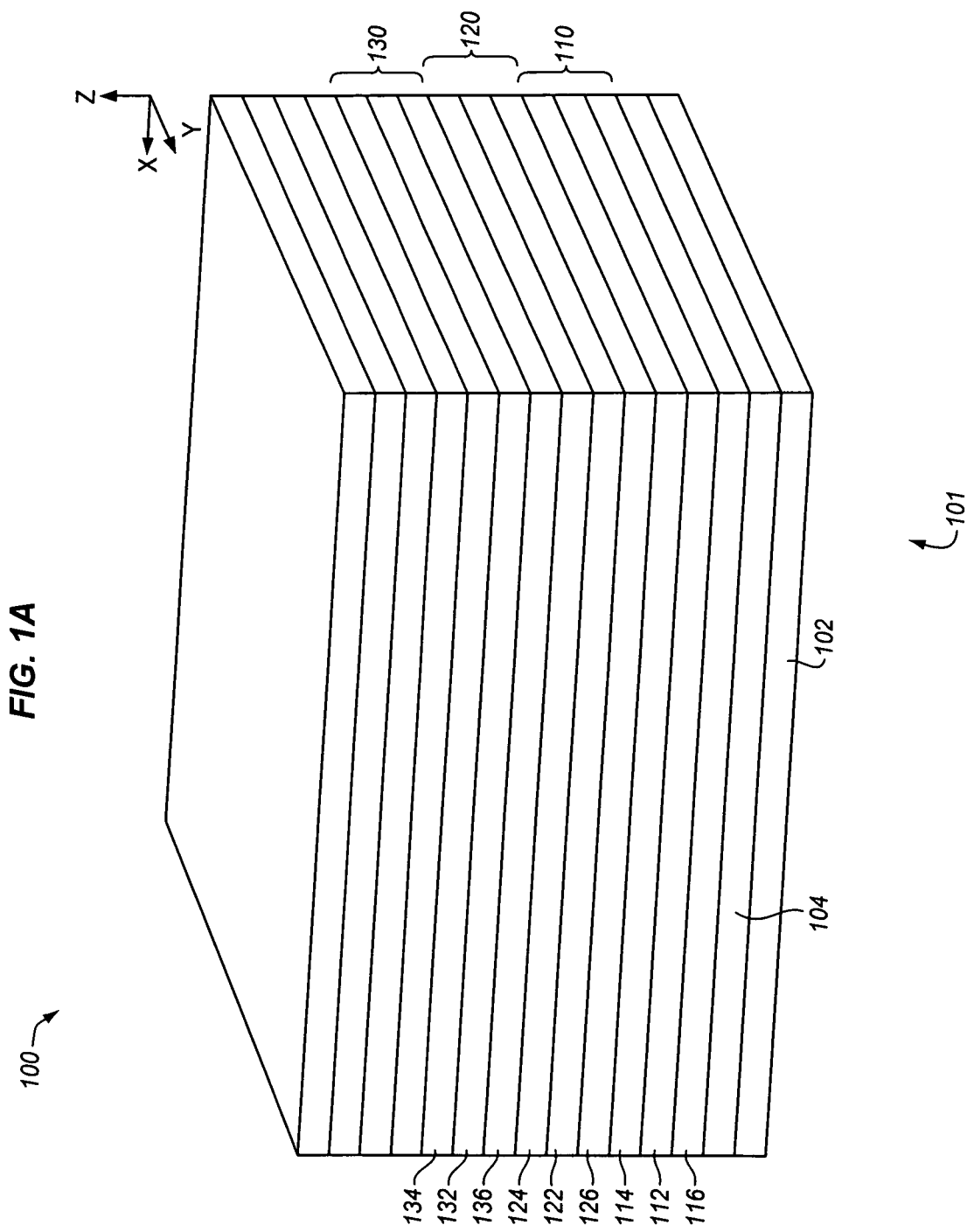
FIG. 1A is an isometric view of a magnetic memory in an exemplary embodiment of the invention.

FIG. 1A is an isometric view of magnetic memory 100 in an exemplary embodiment of the invention. The view in FIG. 1A only shows a portion of magnetic memory 100, as an actual magnetic memory may extend further in the X, Y, or Z direction. Magnetic memory 100 includes a main column 101 of layers comprising a layer of read elements 102, a layer of write elements 104, a first storage stack 110, a second storage stack 120, and a third storage stack 130. Although one main column 101 of layers is shown in FIG. 1A, magnetic memory 100 may include a plurality of main columns as shown in FIG. 1A. For instance, if the main column 101 shown in FIG. 1A provides 4 Mbits of storage (such as 2K in the X-direction and 2K in the Y direction), then magnetic memory 100 may include a plurality of main columns 101 as shown in FIG. 1A to provide 16 Mbits, 32 Mbits, 64 Mbits, etc.

The layer of read elements 102 and the layer of write elements 104 are proximate to storage stack 110, storage stack 110 is proximate to storage stack 120, and storage stack 120 is proximate to storage stack 110 and storage stack 130. Being proximate means that one stack is adjacent to or adjoining another stack. There may be more or less storage stacks in magnetic memory 100 that are not illustrated in this embodiment. For instance, magnetic memory 100 may include a fourth storage stack, a fifth storage stack, etc.

A storage stack comprises any subset of layers adapted to store bits of data. Storage layer 110 includes data storage layer 112, an insulating layer 114, and a heating layer 116. Data storage layer 112 is adapted to store bits of data in form of magnetic domains. Insulating layer 114 is adapted to insulate heating of data storage layer 112 from other data storage layers. Heating layer 116 is adapted to heat data storage layer 112. Storage stack 110 may include additional layers other than shown in FIG. 1A. Alternatively, storage stack 110 may not include all of the layers illustrated in FIG. 1A. For instance, storage stack 110 may not include heating layer 116 in some embodiments, as current may be applied directly to data storage layer 112 in order to heat this layer.

Storage stack 120 may have a similar configuration as storage stack 110 having a data storage layer 122, an insulating layer 124, and a heating layer 126. Storage stack 130 may have a similar configuration as storage stack 110 with a data storage layer 132, an insulating layer 134, and a heating layer 136.

Data storage layer 112 of storage stack 110 defines a first plane in the X-Y direction. Data storage layer 122 of storage stack 120 defines a second plane in the X-Y direction. Data storage layer 132 of storage stack 130 defines a third plane in the X-Y direction. As is evident in FIG. 1A, the first plane, the second plane, and the third plane of the data storage layers are parallel to one another.

FIG. 1B is a cross-sectional view of magnetic memory 100 in an exemplary embodiment of the invention. As illustrated in FIG. 1B, magnetic memory 100 also includes a control system 150 that may be comprised of a plurality of transistors and/or other processing elements. Control system 150 is adapted to control how data is written to the storage stacks 110, 120, and 130, how data is moved between the storage stacks 110, 120, and 130 in the Z direction, and how data is read from the storage stacks 110, 120, and 130.

According to embodiments described herein, data storage layers 112, 122, and 132 are formed from a multi-layer structure. Data storage layers 112, 122, and 132 may thus be also referred to as data storage structures. FIG. 2 is a cross-sectional view of data storage layer 112 in an exemplary embodiment of the invention. Data storage layers 122 and 132, and other data storage layers in magnetic memory 100, may be formed from a similar multi-layer structure as shown in FIG. 2.

Figure 3:
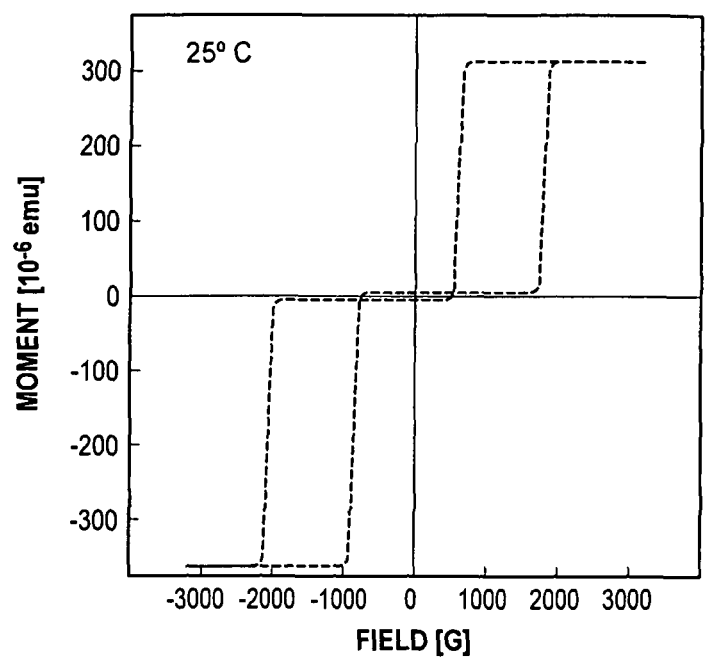
FIG. 3 is a graph illustrating the magnetic moment of a data storage layer at ambient temperatures (25 degrees Celsius) in an exemplary embodiment of the invention.

In FIG. 2, data storage layer 112 includes a first ferromagnetic layer 202, an antiparallel (AP) coupling layer 204, a second ferromagnetic layer 206, and a third ferromagnetic layer 208. Data storage layer 112 has the characteristic of having antiparallel (or antiferromagnetic) coupling at certain temperatures, such as ambient temperatures. When data storage layer 112 exhibits antiparallel coupling, data storage layer 112 is considered to be in an antiparallel coupling state. The temperature where data storage layers have the characteristic of having antiparallel coupling is referred to herein as an antiparallel temperature ($T_{AP}$). To have antiparallel coupling, ferromagnetic layer 202 is antiparallel coupled to the combination of ferromagnetic layers 206 and 208 across AP coupling layer 204 at $T_{AP}$. As a result, the net magnetic moment of data storage layer 112 is zero or near zero at $T_{AP}$. FIG. 3 is a graph illustrating the magnetic moment of data storage layer 112 at $T_{AP}$ (25 degrees Celsius) in an exemplary embodiment of the invention. As is illustrated in FIG. 3, data storage layer 112 has near zero magnetic moment in the absence of a strong magnetic field. This is due to the antiparallel coupling in data storage layer 112.

Data storage layer 112 also has the characteristic of transitioning to parallel (or ferromagnetic) coupling at higher temperatures. When data storage layer 112 is heated to a transition temperature ($T_T$), ferromagnetic layer 202 is no longer antiparallel coupled to ferromagnetic layers 206 and 208 across AP coupling layer 204 and instead becomes coupled parallel to ferromagnetic layer 208. When data storage layer 112 exhibits parallel coupling, data storage layer 112 is considered to be in a parallel coupling state. When in the parallel coupling state, data storage layer 112 has a net remnant magnetic moment. The transition temperature $T_T$ is a temperature close to the Curie temperature of ferromagnetic layer 206 where ferromagnetic layer 206 becomes paramagnetic and ferromagnetic layer 202 and 208 are parallel coupled by dipolar fields.

Figure 4:
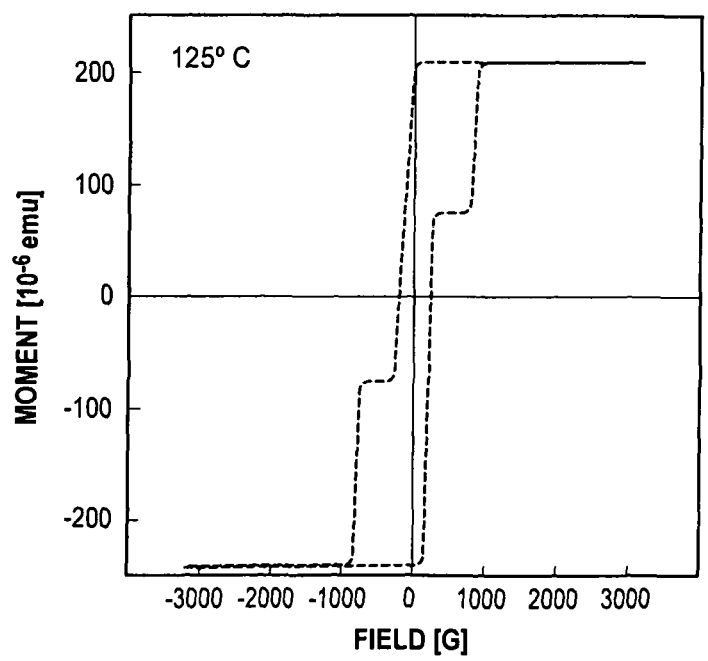
FIG. 4 is a graph illustrating the magnetic moment of a data storage layer at a transition temperature (125 degrees Celsius) in an exemplary embodiment of the invention.

FIG. 4 is a graph illustrating the magnetic moment of data storage layer 112 at $T_T$ (125 degrees Celsius) in an exemplary embodiment of the invention. As is illustrated in FIG. 4, data storage layer 112 has a net magnetic moment at a zero external magnetic field. This is due to the parallel coupling in data storage layer 112.

To create the transition from antiparallel coupling to parallel coupling in data storage layer 112, ferromagnetic layer 202 and ferromagnetic layer 208 are formed from materials having a higher Curie temperature than ferromagnetic layer 206. For instance, ferromagnetic layer 206 may have a Curie temperature of about 100 degrees Celsius while ferromagnetic layers 202 and 208 may have a Curie temperature of about 200 degrees Celsius. At ambient temperatures (around 25 degrees Celsius), ferromagnetic layer 202 is antiparallel coupled to ferromagnetic layers 206 and 208 across AP coupling layer 204. Data storage layer 112 thus has a zero net magnetic moment at this temperature. FIG. 5 is a graph illustrating the magnetic moment of data storage layer 112 as a function of temperature in an exemplary embodiment of the invention. As is evident in FIG. 5, the net magnetic moment of data storage layer 112 at $T_{AP}$ (around 25 degrees Celsius) is about zero.

When data storage layer 112 is heated from an antiparallel temperature ($T_{AP}$) to above the Curie temperature of ferromagnetic layer 206 (about 100 degrees Celsius), the magnetic moment of ferromagnetic layer 206 vanishes and there is no longer exchange coupling between ferromagnetic layer 202 and ferromagnetic layer 208 (see FIG. 2). The effective coupling between ferromagnetic layer 202 and ferromagnetic layer 208 aligns their magnetic moments in parallel. The net magnetic moment of data storage layer 112 is thus the sum of the magnetic moments of ferromagnetic layer 202 and ferromagnetic layer 208 at the transition temperature ($T_T$). In FIG. 5, the graph shows that the net magnetic moment of data storage layer 112 transitions from about zero to about 330 emu/cm$^3$ when data storage layer 112 is heated above about 100 degrees Celsius (which may be considered a parallel temperature in this embodiment).

If data storage layer 112 is cooled below the Curie temperature of ferromagnetic layer 206 to $T_{AP}$, then the magnetic moment of ferromagnetic layer 206 appears again and there is exchange coupling between ferromagnetic layer 202 and the combination of ferromagnetic layer 206 and ferromagnetic layer 208 (see FIG. 2). The magnetic moments of ferromagnetic layer 202 and the combination of ferromagnetic layer 206 and ferromagnetic layer 208 return to an antiparallel coupling state. Also, the net magnetic moment of data storage layer 212 returns to zero or near zero (see FIG. 5).

Another characteristic of data storage layer 112 is that it may not be writable at the transition temperature ($T_T$). Near the transition temperature, the coercivity of data storage layer 112 is still high, so it is not influenced by external magnetic fields. To make data storage layer 112 writable, it is heated above the transition temperature to higher temperatures that are close to the Curie temperatures of ferromagnetic layer 202 and ferromagnetic layer 208, which is referred to as the receiving temperature ($T_R$) ($T_{AP}<T_T<T_R$). At the receiving temperature, the coercivity of data storage layer 112 drops below a write threshold where a data storage layer is writable. The write threshold is less than the magnitude of external magnetic fields that are attempting to write to the data storage layer. When at the receiving temperature, data storage layer 112 is considered to be in a receiving state.

To achieve this characteristic, one of ferromagnetic layer 202 or ferromagnetic layer 208 has a higher coercivity (Hc) than the other (i.e., one layer is harder than the other). When data storage layer 112 is heated to the receiving temperature ($T_R$), the coercivity of the softer one of ferromagnetic layer 202 or ferromagnetic layer 208 drops below the level of external magnetic fields. Thus, the external magnetic fields imprint a plurality of magnetic domains in ferromagnetic layer 202 or ferromagnetic layer 208. The magnetic domains represent a plurality of bits being stored in the data storage layer.

FIG. 6 is another cross-sectional view of data storage layer 112 in an exemplary embodiment of the invention. FIG. 6 illustrates a detailed structural composition of one exemplary embodiment of data storage layer 112, and data storage layer 112 is not limited to this structural composition. In this embodiment, ferromagnetic layer 202, AP coupling layer 204, ferromagnetic layer 206, and ferromagnetic layer 208 each comprise multi-layer structures.

In particular, ferromagnetic layer 202 comprises a multi-layer structure having alternating Co layers 602 and Pd (or Pt) layers 603 (indicated by hatched layers). AP coupling layer 204 comprises a multi-layer structure having a Ru (or Ir) layer 604 and a Co layer 605. The thickness of Ru layer 604 may be about 6 Å. The thickness of Co layer 605 may be about 5 Å. Ferromagnetic layer 206 comprises a multi-layer structure having alternating CoNi layers 606 and Pd (or Pt) layers 607. Ferromagnetic layer 208 comprises a multi-layer structure having alternating Co layers 608 and Pd layers 609.

The multi-layer structure of CoNi layers 606 and Pd layers 607 has a lower Curie temperature than the multi-layer structure of Co layers 602 and Pd layers 603 and the multi-layer structure of Co layers 608 and Pd layers 609. Thus, this embodiment of data storage layer 112 has the characteristics of having antiparallel coupling at antiparallel temperatures, and having parallel coupling at temperatures above the Curie temperature of the multi-layer structure of CoNi layers 606 and Pd layers 607.

Figure 7:
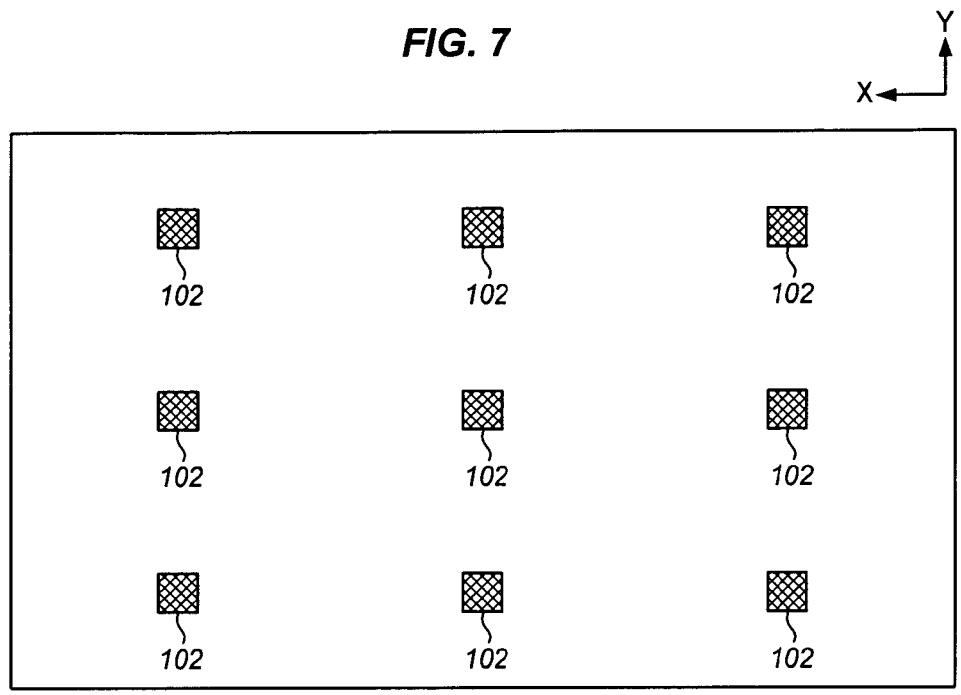
FIG. 7 is a top view of read elements in a magnetic memory in an exemplary embodiment of the invention.

The following FIGS further illustrate the structure of magnetic memory 100 (see FIG. 1) and how data is written to and read from magnetic memory 100. FIG. 7 is a top view of read elements 102 in an exemplary embodiment of the invention. Read elements 102 are in an array in the X-Y direction. Read elements 102 are spaced according to a desired bit density in the data storage layers 112, 122, and 132. Read elements 102 comprise any elements adapted to sense magnetic fields from domains that represent bits stored on data storage layer 112. For example, read elements 102 may comprise Hall Effect elements, spin valve elements, or tunnel valve elements.

Figure 8:
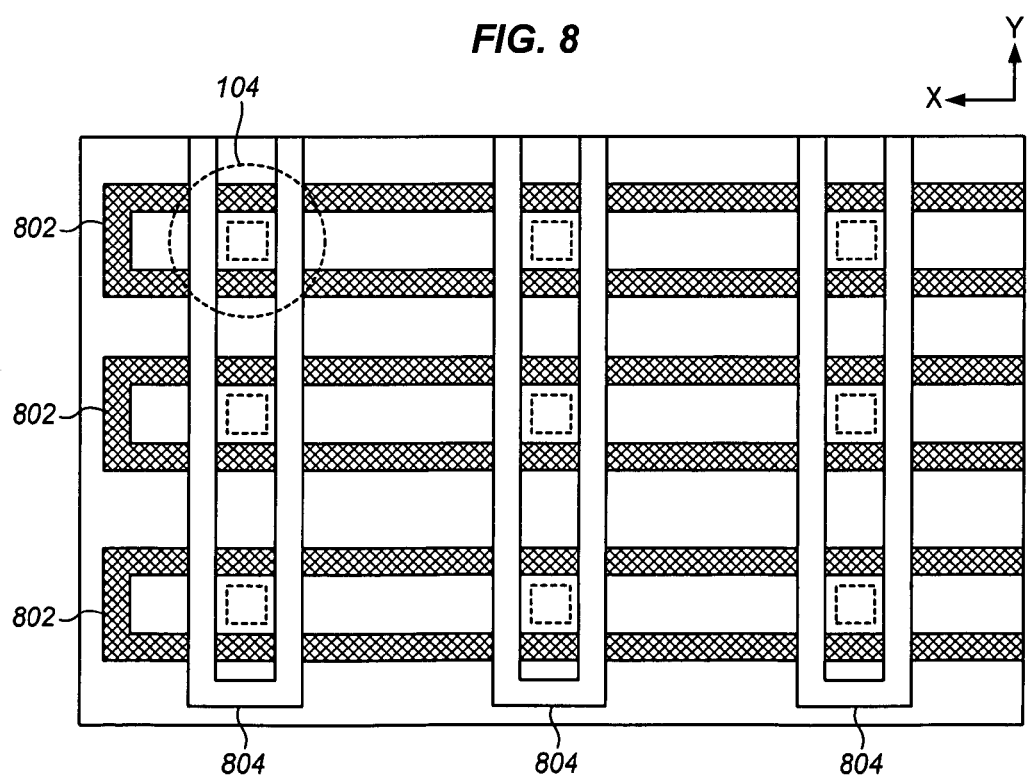
FIG. 8 is a top view of write elements in a magnetic memory in an exemplary embodiment of the invention.

FIG. 8 is a top view of write elements 104 in an exemplary embodiment of the invention. Write elements 104 are formed from a cross-point array of current loops. An individual write element 104 is indicated by the dotted circle in FIG. 8. Current loops 802 (which are formed from conductive material) travel in the X direction, and current loops 804 travel in the Y direction. The intersection points of the current loops correspond with the locations of the read elements 102 which are illustrated as dotted boxes. Current loops 802 and 804 each generate a magnetic field of magnitude X. In locations where the current loops do not intersect, the magnetic field has a magnitude of X. In locations where the current loops intersect, the magnetic fields from both current loops are additive to generate a magnetic field having a magnitude of 2×. The 2× magnetic field is used to write bits to data storage layer 112 of FIG. 1.

According to features and aspects herein, magnetic memory 100 (see FIG. 1) is adapted to provide storage of bits in the data storage layers 112, 122, and 132 (and possibly other data storage layers not shown). To store the bits in magnetic memory 100, each of the data storage layers 112, 122, and 132 are able to store bits in the X-Y direction. Magnetic memory 100 is also able to transfer bits in the Z direction in FIG. 1 between the data storage layers 112, 122, and 132. As previously stated, data storage layers 112, 122, and 132 each include an antiferromagnetically (AF) coupled sub-layer structure, which exhibits a net magnetic moment of about zero at ambient temperatures.

FIGS. 9A and 9B are flow charts illustrating a method 900 of writing bits to magnetic memory 100 in an exemplary embodiment of the invention. FIG. 9A illustrates the initial writing of bits to data storage layer 112 by write elements 104. In step 902, control system 150 heats data storage layer 112 to receiving temperature ($T_R$) where the data storage layer 112 transitions from the antiparallel coupling state to the receiving state. When in the receiving state, data storage layer 112 is writable, such as by write elements 104.

In step 904, write elements 104 apply magnetic fields to data storage layer 112 to create or imprint a plurality of magnetic domains in data storage layer 112. A magnetic domain comprises a region of magnetization surrounded by regions of a different magnetization (or background magnetization). The magnetic domains represent a plurality of bits of data that is written into data storage layer 112. Magnetic domains may also be referred to herein as regions of magnetization or magnetic imprints.

In step 906, control system 150 cools data storage layer 112. Control system 150 cool data storage layer 112 down to the antiparallel temperature ($T_{AP}$) so that data storage layer 112 transitions from the receiving state back to the antiparallel coupling state. When in the antiparallel coupling state, data storage layer 112 cannot be written to by any neighboring data storage layers 122 and 132. Also, data storage layer 112 does not emit strong magnetic stray fields that may influence the magnetization of neighboring data storage layers 122 and 132.

FIG. 10 is an isometric view of a portion of data storage layer 112 illustrating bits written to data storage layer 112. Data storage layer 112 has a background magnetization, such as a magnetization perpendicular to the plane pointing downward in FIG. 10. Bits are written to data storage layer 112 in the form of magnetic domains 1002. The magnetic domains 1002 are formed by changing the magnetization locally to a polarity opposite than the primary magnetization of data storage layer 112. The magnetization of magnetic domains 1002 is illustrated by arrows in FIG. 10. The existence of a magnetic domain 1002 magnetized opposite to the background magnetization indicates one binary value of a bit, such as a "1". The absence of an oppositely-magnetized domain 1002 in a particular region in data storage layer 112 indicates another binary value of a bit, such as a "0". The absence of a magnetic domain 1002 in FIG. 10 is illustrated as a dotted circle.

FIG. 11 illustrates magnetic memory 100 with bits written into data storage layer 112 according to step 904 of FIG. 9A. A magnetic domain has been imprinted into data storage layer 112 by the rightmost write element 104 and the middle write element 104. The magnetic domains are indicated by a single arrow pointing upward in a dotted box representing a region proximate to the rightmost write element 104 and a region proximate to the middle write element 104. The background magnetization with no opposite domain has been imprinted into data storage layer 112 proximate to the leftmost write element 104. The absence of an opposite magnetic domain is indicated by a dotted box representing a region proximate to the leftmost write element 104 that does not include an arrow.

With the bits written into data storage layer 112 in FIG. 11, control system 150 may transfer the bits up main column 101 of magnetic memory 100 to data storage layer 122 according to the method described in FIG. 9B. In step 908, control system 150 heats data storage layer 122 to the receiving temperature ($T_R$). By heating to the receiving temperature, data storage layer 122 transitions from the antiparallel coupling state to the receiving state (i.e., the coercivity of data storage layer 112 drops below a level of external magnetic fields being emitted from a transmitting layer). Data storage layer 122 may be considered the "receiving" data storage layer as it will be receiving bits from data storage layer 112.

In step 910, control system 150 heats data storage layer 112 (if already cooled) to the transition temperature ($T_T$) where the data storage layer 112 transitions from the antiparallel coupling state to the parallel coupling state. When data storage layer 112 is in the parallel coupling state, the magnetic domains representing the stored data are emitted as magnetic stray fields. Data storage layer 112 may be considered the "transmitting" data storage layer. The external stray fields imprint the magnetic domains from data storage layer 112 into data storage layer 122. By imprinting the magnetic domains from data storage layer 112 to data storage layer 122, the bits stored in data storage layer 112 are copied to data storage layer 122 in the Z direction (upward in FIG. 11). FIG. 12 illustrates magnetic memory 100 with the bits copied from data storage layer 112 to data storage layer 122. The absence of an isolated magnetic domain is also illustrated in FIG. 12 by a dotted box In step 912 of FIG. 9B, control system 150 cools data storage layer 122. Data storage layer 122 cools from $T_R$ to $T_{AP}$ where data storage layer 122 transitions from the receiving state to the antiparallel coupling state. Control system 150 then cools data storage layer 112 to $T_{AP}$ in order to transition data storage layer 112 from the parallel coupling state back to an antiparallel coupling state in step 914. Although heat is used in this embodiment to imprint the magnetic domains from data storage layer 112 to data storage layer 122, other methods or means may be used to facilitate the transfer of the magnetic domains.

With the bits written into data storage layer 122 in FIG. 12, control system 150 may transfer the bits up main column 101 again. Control system 150 may repeat steps 908-914 as shown in FIG. 9B to transfer the bits from data storage layer 122 (the "transmitting" data storage layer) to data storage layer 132 (the "receiving" data storage layer). FIG. 13 illustrates magnetic memory 100 with the bits copied from data storage layer 122 to data storage layer 132.

After copying bits from one data storage layer to another, control system 150 may erase the bits from the transmitting data storage layer. For instance, to erase bits from data storage layer 112, control system 150 may heat data storage layer 112 above its Curie temperature. As illustrated in FIG. 2, if control system 150 heats data storage layer 112 to the Curie temperature of ferromagnetic layer 202 and ferromagnetic layer 208, then data storage layer 112 returns to its primary or background magnetization after it is cooled. Control system 150 may heat and cool data storage layer 112 in the presence of a bias field in order to return data storage layer 112 to its primary or background magnetization. The bits are thus erased from data storage layer 112.

In FIG. 13, the bits originally written to data storage layer 112 have been copied to data storage layer 122 and data storage layer 132. The bits may be stored in data storage layer 132, or may be transferred up the stack of magnetic memory 100 (although additional storage stacks have not been illustrated in FIG. 13). With the bits stored in data storage layer 132, control system 150 may erase the bit pattern stored in data storage layer 112 and write elements 104 may write another bit pattern into data storage layer 112. Control system 150 may erase the bit pattern stored in data storage layer 122 and transfer the new bit pattern from data storage layer 112 to data storage layer 122. With one bit pattern stored in data storage layer 132 and another bit pattern stored in data storage layer 122, control system 150 may erase the bit pattern stored in data storage layer 112 and write elements 104 may write yet another bit pattern into data storage layer 112 if desired.

Figure 14A:
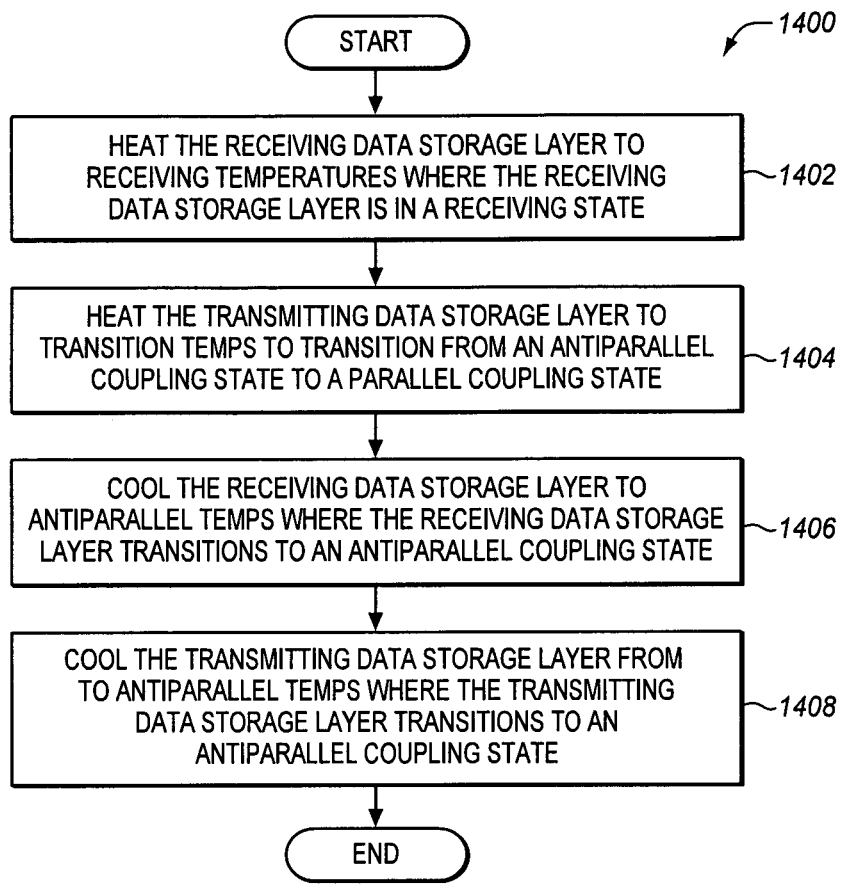
FIGS. 14A and 14B are flow charts illustrating a method of reading bits from a magnetic memory in an exemplary embodiment of the invention.
Figure 14B:
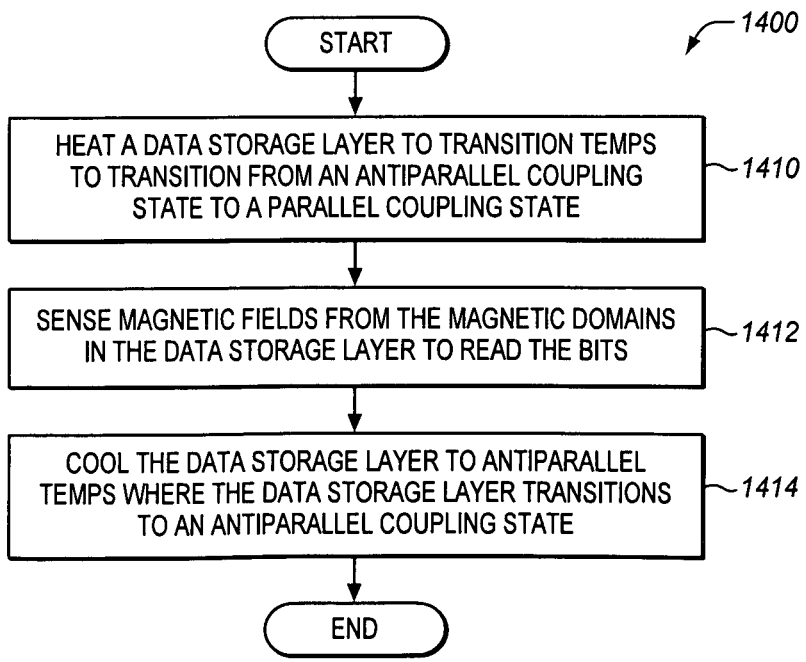
Figure 15:
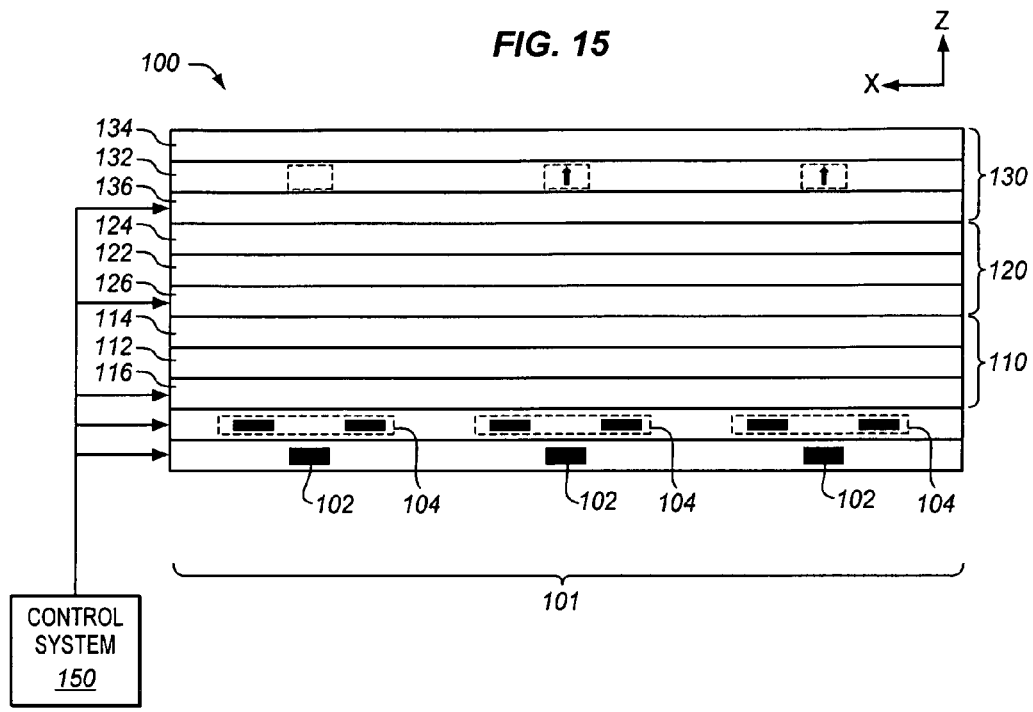
FIG. 15 illustrates a magnetic memory with bits stored in a third data storage layer in an exemplary embodiment of the invention.

At some point, the bits stored in data storage layers 112, 122, or 132 may be read from magnetic memory 100. FIGS. 14A and 14B are flow charts illustrating a method 1400 of reading bits from magnetic memory 100 in an exemplary embodiment of the invention. To read bits from a particular data storage layer, the bits may need to be moved down main column 101 (see FIG. 13) until the bits reach data storage layer 112 (which is proximate to read elements 102). For example, assume that bits are stored in data storage layer 132 which are to be read. FIG. 15 illustrates magnetic memory 100 with the bits stored in data storage layer 132 in an exemplary embodiment. To read the bits in data storage layer 132, the bits need to be transferred down main column 101 to data storage layer 112 because data storage layer 112 is proximate to read elements 102. If other bit patterns are stored in data storage layer 112 or data storage layer 122, these bits patterns are read and temporarily offloaded to an overflow storage system, which is described in FIG. 17.

In step 1402 of FIG. 14A, control system 150 heats data storage layer 122 to $T_R$. By heating to the receiving temperature ($T_R$), data storage layer 122 transitions from the antiparallel coupling state to the receiving state (i.e., the coercivity of data storage layer 112 drops below a level of external magnetic fields being emitted from a transmitting layer). Data storage layer 122 may be considered the "receiving" data storage layer as it will be receiving bits from data storage layer 132.

In step 1404, control system 150 heats data storage layer 132 (if already cooled) to $T_P$ where the data storage layer 132 transitions from the antiparallel coupling state to the parallel coupling state. When data storage layer 132 is in a parallel coupling state, the magnetic domains representing the stored data are emitted as magnetic stray fields. Data storage layer 132 may be considered the "transmitting" data storage layer. The external stray fields imprint the magnetic domains from data storage layer 132 into data storage layer 122. By imprinting the magnetic domains from data storage layer 132 to data storage layer 122, the bits stored in data storage layer 132 are copied to data storage layer 122 in the Z direction (downward in FIG. 15).

In step 1406, control system 150 cools data storage layer 122. Data storage layer 122 cools from $T_R$ to $T_{AP}$ where data storage layer 122 transitions from the receiving state to the antiparallel coupling state. Control system 150 then cools data storage layer 112 to $T_{AP}$ in order to transition data storage layer 112 from the parallel coupling state back to the antiparallel coupling state in step 1408 (see FIG. 14A). Although heat is used in this embodiment to imprint the magnetic domains from data storage layer 132 to data storage layer 122, other methods or means may be used to facilitate the transfer of the magnetic domains.

Figure 16:
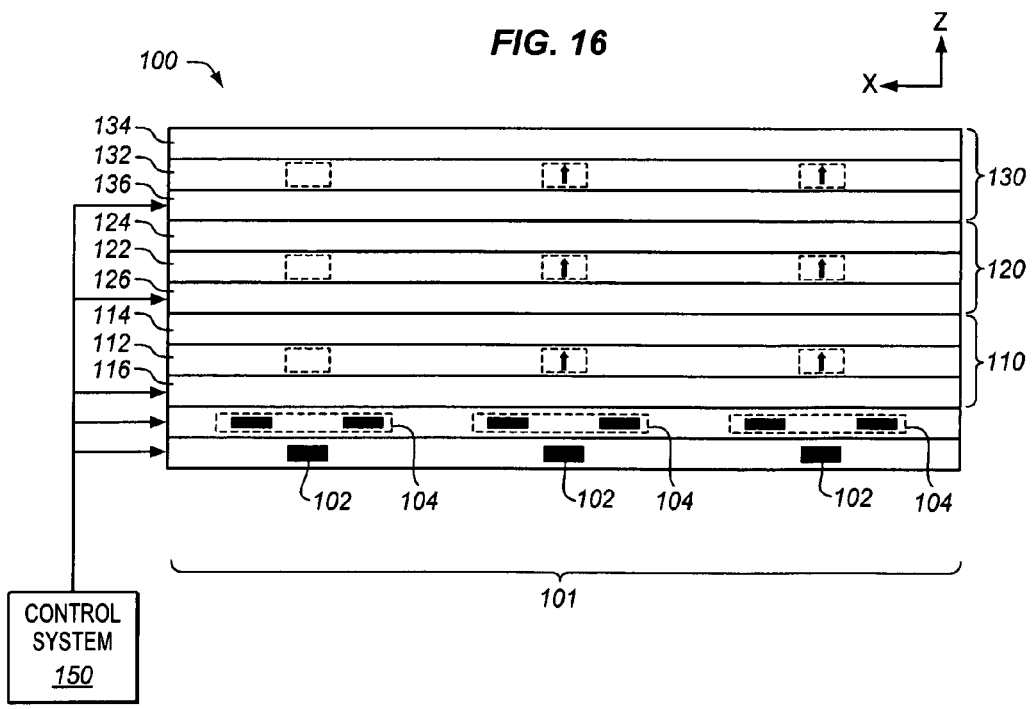
FIG. 16 illustrates a magnetic memory with the bits copied from a third data storage layer to a second data storage layer and from the second data storage layer to a first data storage layer in an exemplary embodiment of the invention.

The bits of data to be read are now in data storage layer 122 and they need to be transferred down main column 101 into data storage layer 112 to be read. Thus, control system 150 repeats steps 1402-1408 of FIG. 14A to copy the bits from data storage layer 122 (the transmitting data storage layer) to data storage layer 112 (the receiving data storage layer). FIG. 16 illustrates magnetic memory 100 with the bits copied from data storage layer 132 to data storage layer 122 and from data storage layer 122 to data storage layer 112.

After copying bits from one data storage layer to another, control system 150 may erase the bits from the transmitting data storage layer. Control system 150 may erase the bits in a similar manner as previously described.

With the bits transferred to data storage layer 112 that is proximate to read elements 102, the bits are in a position to be read by read elements 102. In step 1410 of FIG. 14B, control system 150 heats data storage layer 112 (if already cooled) to $T_T$ where the data storage layer 112 transitions from the antiparallel coupling state to the parallel coupling state. When data storage layer 112 is in a parallel coupling state, the magnetic domains representing the stored data are emitted as magnetic stray fields.

In step 1412, read elements 102 sense magnetic fields from the magnetic domains in data storage layer 112 to read the bits from data storage layer 112. If read elements 102 are spin valves, for instance, the resistance of the spin valve will depend on the direction and magnitude of the field emanating from data storage layer 112. For example, upward-pointing magnetic fields from a magnetic domain will result in one value of resistance, while a downwardly-pointing magnetic field will result in a second resistance. An isolated magnetic domain thus results in one resistance, while the background magnetization, or no isolated domain, results in a second resistance.

In step 1414, control system 150 may then cool data storage layer 112 from $T_T$ to $T_{AP}$ to transition data storage layer 112 from the parallel coupling state back to the antiparallel coupling state.

Figure 17:
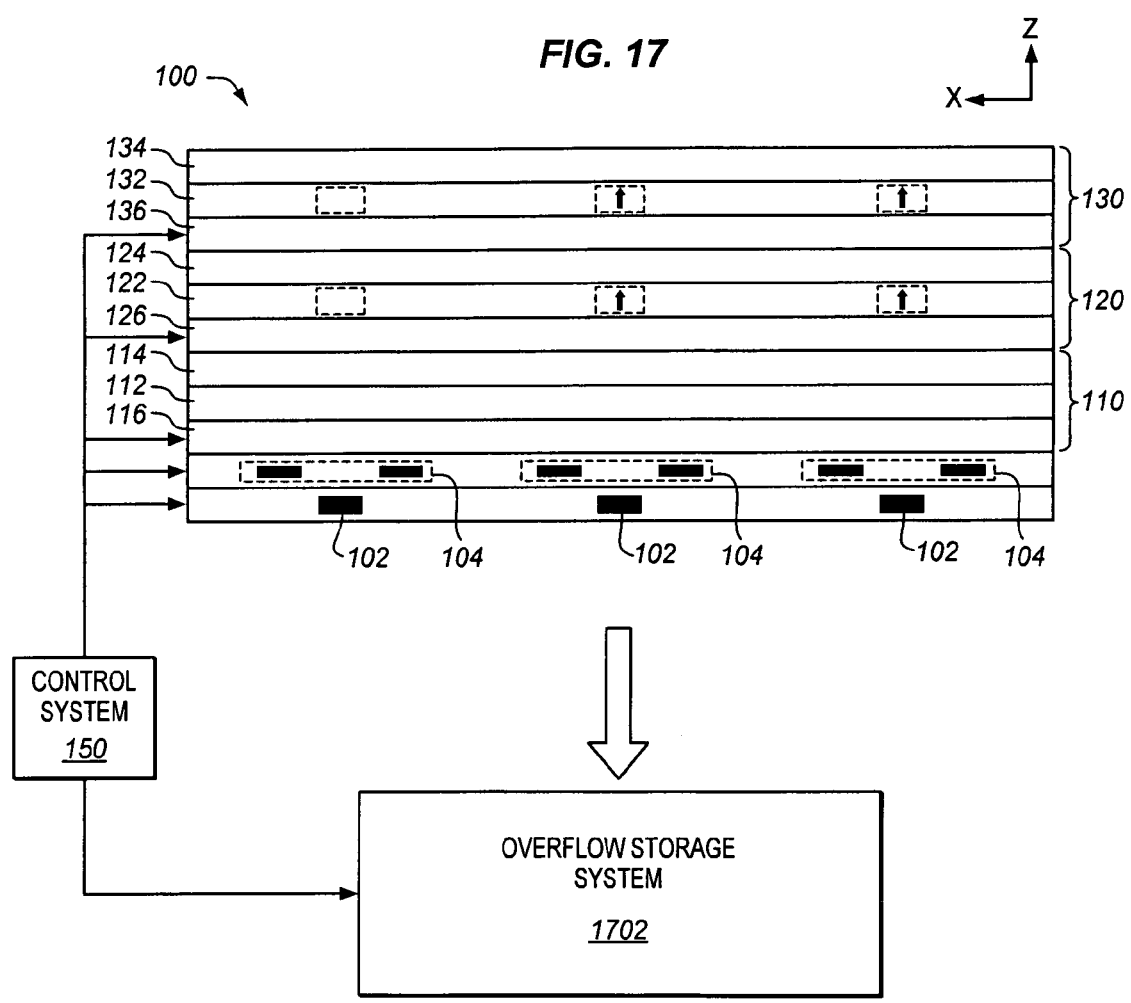
FIG. 17 illustrates a magnetic memory that includes an overflow storage system in an exemplary embodiment of the invention.

During the read process described above, data may need to be moved from data storage layer 112, data storage layer 122, etc, in order to move the data to be read down main column 101. To temporarily move the data, an overflow storage system may be used. FIG. 17 illustrates magnetic memory 100 that includes an overflow storage system 1702. Overflow storage system 1702 may comprise any desired memory adapted to store the bits read from data storage layer 112. Overflow storage system 1702 may include one or more storage stacks much like storage stacks 110, 120, and 130. Overflow storage system 1702 may serve a single column of magnetic memory 100 shown in FIG. 17, or may serve multiple columns of magnetic memory 100 which are not shown. As illustrated in FIG. 17, both data storage layer 122 and data storage layer 132 are storing bits. Data storage layer 122 stores a first bit pattern and data storage layer 132 stores a second bit pattern. If a request is received in magnetic memory 100 for the bits stored in data storage layer 132, then control system 150 operates as described in FIG. 14A to move the first bit pattern in data storage layer 122 to overflow storage system 1702. Control system 150 also operates as described in FIGS. 14A and 14B to move the second bit pattern in data storage layer 132 to data storage layer 112 and to read the bits from data storage layer 112. After the second bit pattern previously stored in data storage layer 132 has been read, control system 150 may write the first bit pattern being stored in overflow storage system 1702 back onto data storage layer 122 or another data storage layer in magnetic memory 100.

Figure 18:
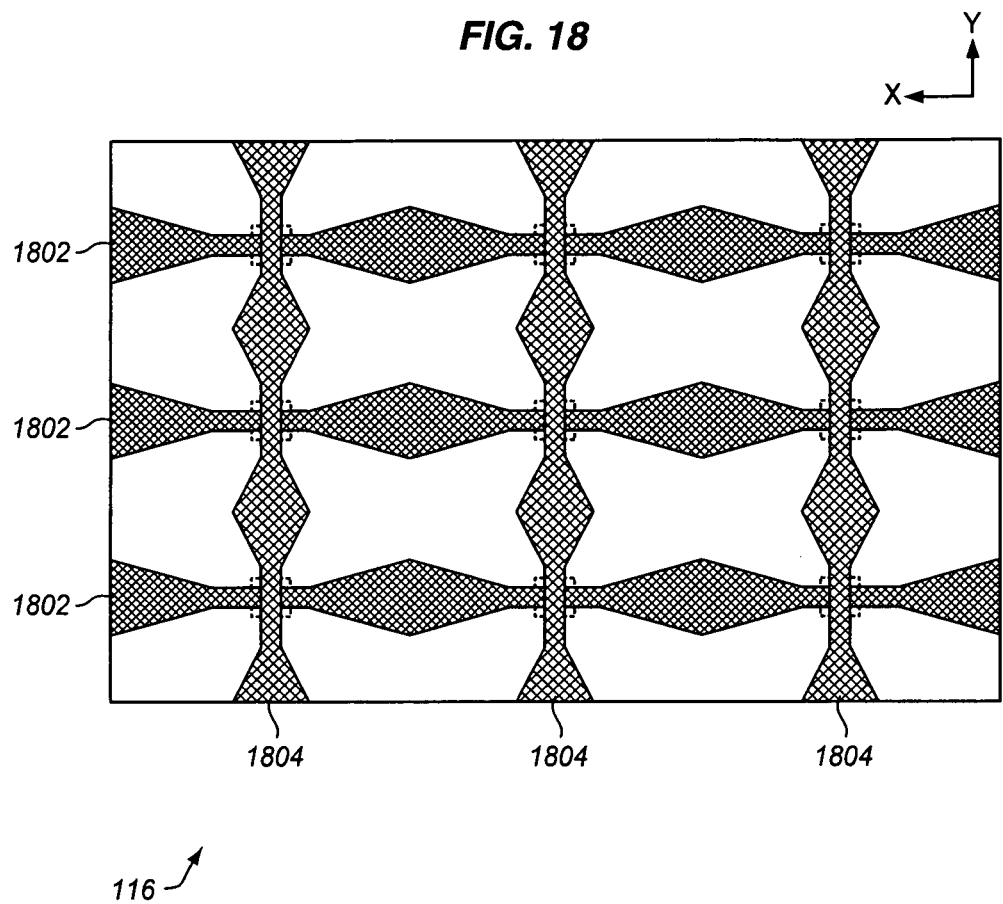
FIG. 18 illustrates a heating layer comprised of intersecting conductors in an exemplary embodiment of the invention.

As illustrated in FIG. 1, storage stacks 110, 120, and 130 may each include a heating layer 116, 126, and 136. FIG. 18 illustrates a heating layer 116 comprised of intersecting conductors in an exemplary embodiment of the invention. FIG. 18 is a top view of a heating layer 116 comprising intersecting conductors. The horizontal conductors 1802 and the vertical conductors 1804 in FIG. 18 intersect at a plurality of points. The intersection points of the conductors 1802, 1804 correspond with the locations of the magnetic domains in data storage layer 112 (i.e., the locations where bits are stored). In this embodiment, conductors 1802, 1804 are not uniform in width. The widths of conductors 1802, 1804 are narrower at the intersection points (i.e., the bit locations) as compared to the widths of conductors 1802, 1804 between the intersection points. With conductors 1802, 1804 narrower at the intersections points, the power dissipation is higher which results in higher temperatures at the intersections points. With conductors 1802, 1804 wider between the intersections points, the power dissipation is lower which results in lower temperatures between the intersections points. One advantage of this configuration is that less power is consumed as higher temperatures are only provided at the intersections points. Another advantage is that higher thermal gradients may be acquired in data storage layer 112 along the lengths on the conductors 1802, 1804 because the regions in data storage layer 112 between the bit locations remain cooler. Another advantage is faster cooling time as a smaller volume of data storage layer 112 is heated and thus cooled. Another advantage is that the resistance of the wires can be lower as the average width of the conductors 1802, 1804 is larger.

In regards to FIG. 10, magnetic domains 1002 may grow larger when being transferred from one data storage layer to another. The magnetic fields from the magnetic domains 1002 are not perfectly perpendicular and tend to diverge at the domain walls. Due to this occurrence, the magnetic domains may grow in size when being transferred to successive data storage layers which can affect the overall density of the magnetic memory 100 (see FIG. 1). According to features and aspects herein, the data storage layers in magnetic memory 100 may be patterned in one embodiment to control the size of the magnetic domains.

Figure 19:
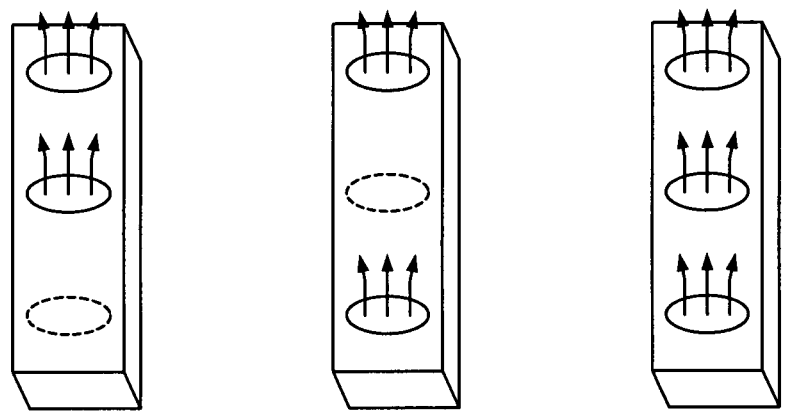
FIG. 19 illustrates a data storage layer as patterned in an exemplary embodiment of the invention.

FIG. 19 illustrates data storage layer 112 as patterned in an exemplary embodiment of the invention. Data storage layer 112 is patterned into strips in this embodiment. The locations of the strips correspond with the magnetic domains in data storage layer 112. The width of the strips corresponds with a desired size of the magnetic domains. For instance, if the desired width of the magnetic domains is 1 micron, then the width of the strips may be 1.2 microns. Because the magnetic domains are able to spread along the length of the strips in data storage layer 112 (which is up and down in FIG. 19), the next data storage layer in the stack of magnetic memory 100, which is data storage layer 122, may also be patterned into strips that are orthogonal to the strips of data storage layer 112.

Figure 20:
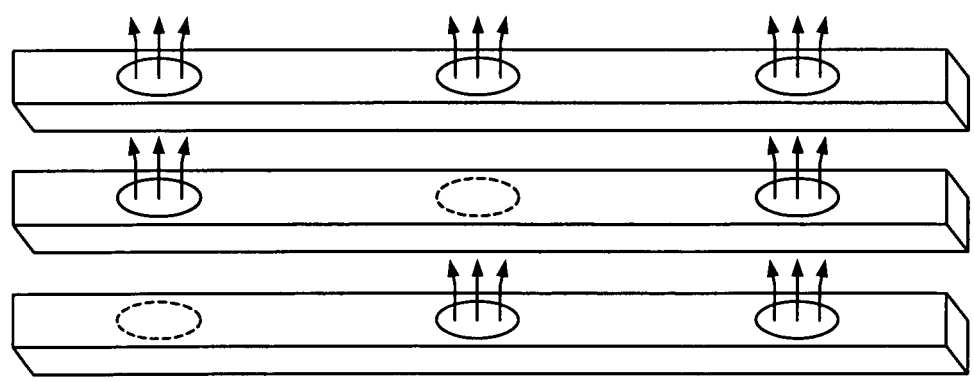
FIG. 20 illustrates another data storage layer as patterned in an exemplary embodiment of the invention.

FIG. 20 illustrates data storage layer 122 as patterned in an exemplary embodiment of the invention. Data storage layer 122 is also patterned into strips similar to data storage layer 112. However, the strips of data storage layer 122 are orthogonal to the strips in data storage layer 112. The magnetic domains are able to spread along the length of the strip (which is left to right in FIG. 20), but the magnetic domains are controlled in those directions by the previous orthogonal strips. By making the strips of the subsequent data storage layer orthogonal to the previous data storage layer, the spread of the magnetic domains can be controlled in all directions. If data storage layer 132 in FIG. 1 is patterned into strips, then the strips would again be orthogonal to the strips in data storage layer 122.

Figure 21:
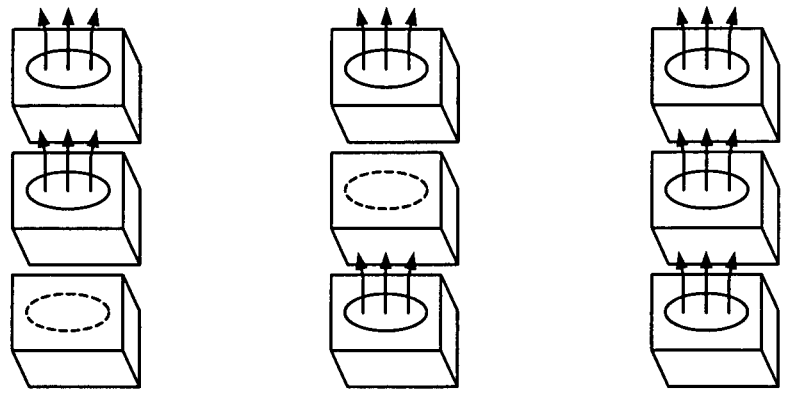
FIG. 21 illustrates another data storage layer as patterned in another exemplary embodiment of the invention.

Data storage layers may be patterned into different shapes other than strips. For instance, a data storage layer may be patterned into domain "islands", which is a section of material having a size of a desired magnetic domain. FIG. 21 illustrates data storage layer 112 as patterned in another exemplary embodiment of the invention. Data storage layer 112 is patterned into domain-sized islands in this embodiment. The locations of the islands correspond with the magnetic domains in data storage layer 112. The area of the islands corresponds with a desired size of the magnetic domains. The next data storage layer in the stack of magnetic memory 100, which is data storage layer 122, may also be patterned into similar islands.

Figure 22:
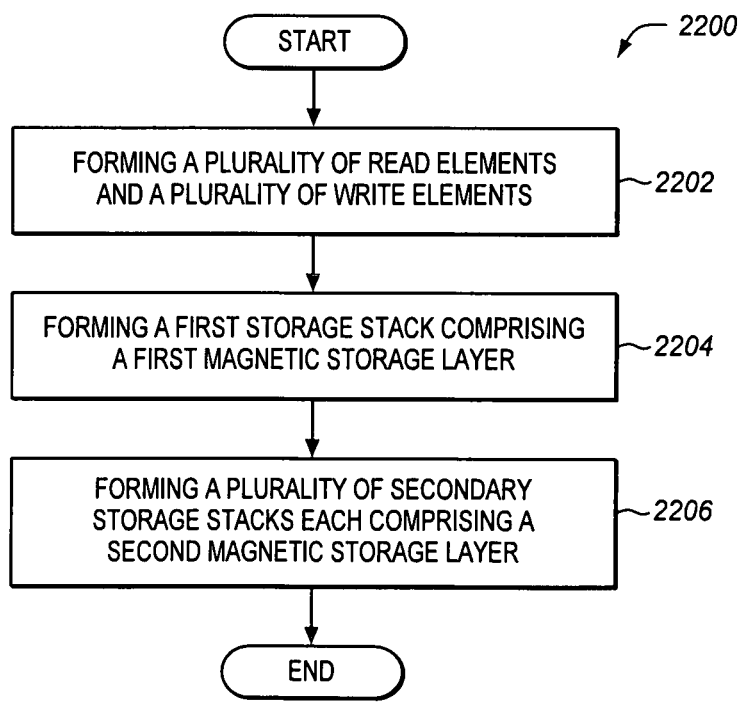
FIG. 22 is a flow chart illustrating a method of fabricating a magnetic memory in an exemplary embodiment of the invention.

FIG. 22 is a flow chart illustrating a method 2200 of fabricating a magnetic memory in an exemplary embodiment of the invention. Method 2200 may be used to fabricate magnetic memory 100 illustrated in the previous figures. Step 2202 comprises forming a plurality of read elements and a plurality of write elements. The read element may be formed in a first layer and the write elements may be formed in one or more other layers. For instance, the read elements may comprise an array of Hall Effect elements, spin valve elements, or tunnel valve elements. The write elements may comprise a plurality of current loops that correspond with the read elements. Step 2204 comprises forming a first storage stack proximate to the plurality of read elements and the plurality of write elements. The first storage stack includes a first data storage layer defining a first plane. Step 2206 comprises forming a plurality of secondary storage stacks proximate to the first storage stack. The secondary storage stacks each include a second data storage layer defining secondary planes that are parallel to the first plane.

Figure 23:
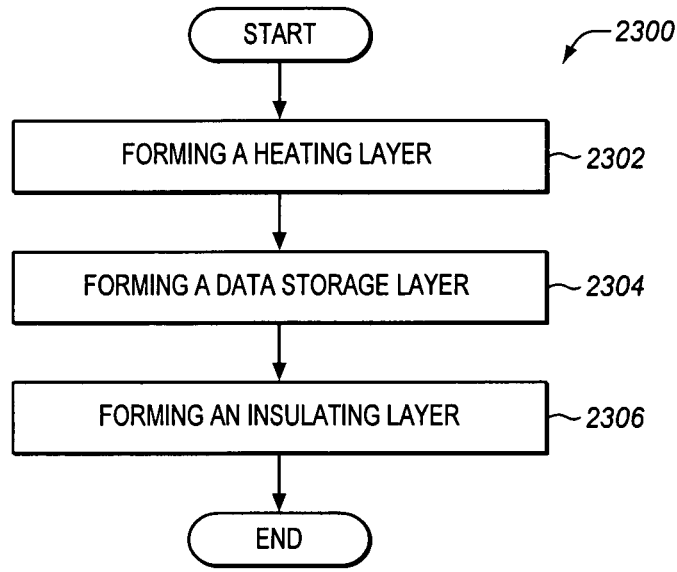
FIG. 23 is a flow chart illustrating a method of fabricating a storage stack in an exemplary embodiment of the invention.

FIG. 23 is a flow chart illustrating a method 2300 of fabricating a storage stack, such as storage stack 110 in FIG. 1, in an exemplary embodiment of the invention. Step 2302 comprises forming a heating layer 116. Step 2304 comprises forming a data storage layer 112 proximate to heating layer 116. Step 2306 comprises forming an insulating layer 114 proximate to data storage layer 112.

Figure 24:
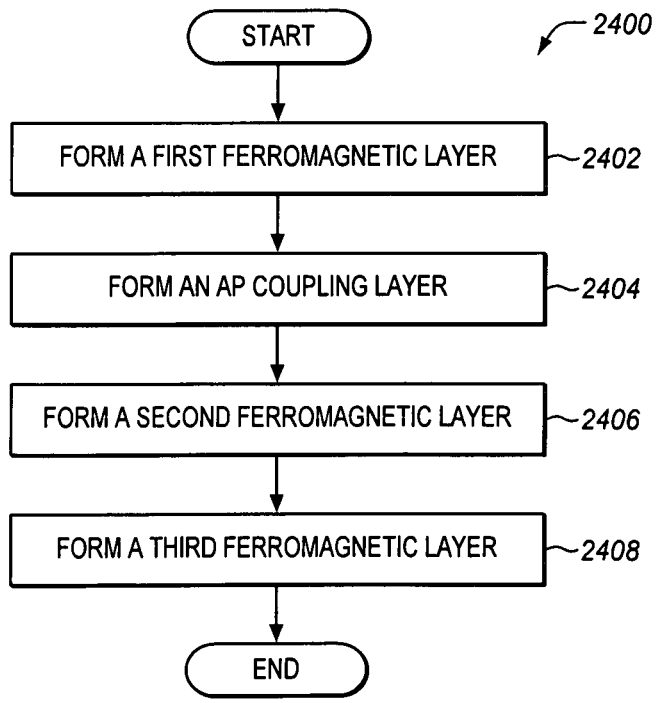
FIG. 24 is a flow chart illustrating a method of fabricating a data storage layer in an exemplary embodiment of the invention.

FIG. 24 is a flow chart illustrating a method 2400 of fabricating a data storage layer in an exemplary embodiment of the invention. Method 2400 will be described with reference to FIG. 2. Step 2402 comprises forming a first ferromagnetic layer 202. As stated in other embodiments, ferromagnetic layer 202 may comprise a multi-layer structure such as shown in FIG. 6. Step 2404 comprises forming an antiparallel (AP) coupling layer 204. Step 2406 comprises forming a second ferromagnetic layer 206. Ferromagnetic layer 206 may comprise a multi-layer structure such as shown in FIG. 6. Step 2408 comprises forming a third ferromagnetic layer 208. Ferromagnetic layer 208 may comprise a multi-layer structure such as shown in FIG. 6. The data storage layer formed according to method 2400 has the characteristics defined in previous embodiments of transitioning from an antiparallel coupling state at ambient temperatures to a parallel coupling state at a transition temperature.

Although specific embodiments were described herein, the scope of the invention is not limited to those specific embodiments. The scope of the invention is defined by the following claims and any equivalents thereof.

We claim:

1. A magnetic memory, comprising:
    a first storage stack having a first data storage layer defining a first plane and adapted to store bits of data; and
    a plurality of secondary storage stacks fabricated on top of one another on the first storage stack, wherein each of the secondary storage stacks includes a second data storage layer defining a secondary plane that is parallel to the first plane and adapted to store bits of data;
    wherein the first data storage layer and the second data storage layers are each formed from a multi-layer structure exhibiting an antiparallel coupling state at ambient temperatures.

2. The magnetic memory of claim 1 wherein the multi-layer structure further exhibits a transition from the antiparallel coupling state to a parallel coupling state at a transition temperature that is higher than the ambient temperatures.

3. The magnetic memory of claim 2 wherein the multi-layer structure further exhibits a transition from the antiparallel coupling state to a receiving state at a receiving temperature that is higher than the ambient temperatures and the transition temperature, wherein the receiving state represents a drop in coercivity of the multi-layer structure below a write threshold.

4. The magnetic memory of claim 1 wherein the multi-layer structure comprises:
    a first ferromagnetic layer;
    an antiparallel coupling layer formed on the first ferromagnetic layer;
    a second ferromagnetic layer formed on the antiparallel coupling layer; and
    a third ferromagnetic layer formed on the second ferromagnetic layer;
    wherein the first ferromagnetic layer is antiparallel coupled to the second ferromagnetic layer and the third ferromagnetic layer at the ambient temperatures;
    wherein the first ferromagnetic layer is parallel coupled to the third ferromagnetic layer at a transition temperature that is higher than the ambient temperatures.

5. The magnetic memory of claim 4 wherein the first ferromagnetic layer and the third ferromagnetic layer have a Curie temperature that is higher than the Curie temperature of the second ferromagnetic layer.

6. The magnetic memory of claim 4 wherein the first ferromagnetic layer and the third ferromagnetic layer each comprise multi-layer structures comprised of alternating layers of Co and Pd or Pt.

7. The magnetic memory of claim 4 wherein:
    the second ferromagnetic layer comprises a multi-layer structure comprised of alternating layers of CoNi and Pd or Pt; and
    the antiparallel coupling layer is comprised of Ru or Ir.

8. A method of fabricating a magnetic memory, the method comprising:
    forming a first storage stack that includes a first data storage layer defining a first plane and adapted to store bits of data; and
    forming a plurality of secondary storage stacks on top of one another on the first storage stack, wherein each of the secondary storage stacks includes a second data storage layer defining a secondary plane that is parallel to the first plane and adapted to store bits of data;
    wherein the first data storage layer and the second data storage layers are each formed from a multi-layer structure exhibiting an antiparallel coupling state at ambient temperatures.

9. The method of claim 8 wherein the multi-layer structure further exhibits a transition from the antiparallel coupling state to a parallel coupling state at a transition temperature that is higher than the ambient temperatures.

10. The method of claim 9 wherein the multi-layer structure further exhibits a transition from the antiparallel coupling state to a receiving state at a receiving temperature that is higher than the ambient temperatures and the transition temperature, wherein the receiving state represents a drop in coercivity of the multi-layer structure below a write threshold.

11. The method of claim 10 wherein:
forming a first storage stack comprises forming a first heating layer, forming the first data storage layer, and forming a first insulating layer; and
forming a plurality of secondary storage stacks comprises forming a second heating layer, forming the second data storage layer, and forming a second insulating layer.

12. The method of claim 8 wherein forming the multi-layer structure of the first data storage layer or the second data storage layer comprises:
forming a first ferromagnetic layer;
forming an antiparallel coupling layer on the first ferromagnetic layer;
forming a second ferromagnetic layer on the antiparallel coupling layer; and
forming a third ferromagnetic layer on the second ferromagnetic layer;
wherein the first ferromagnetic layer is antiparallel coupled to the second ferromagnetic layer and the third ferromagnetic layer at the ambient temperatures;
wherein the first ferromagnetic layer is parallel coupled to the third ferromagnetic layer at a transition temperature that is higher than the ambient temperatures.

13. The method of claim 12 wherein the first ferromagnetic layer and the third ferromagnetic layer have a Curie temperature that is higher than the second ferromagnetic layer.

14. The method of claim 12 wherein:
forming the first ferromagnetic layer comprises forming alternating layers of Co and Pd or Pt; and
forming the third ferromagnetic layer comprises forming alternating layers of Co and Pd or Pt.

15. The method of claim 14 wherein:
forming the second ferromagnetic layer comprises forming alternating layers of CoNi and Pd or Pt; and
forming the antiparallel coupling layer comprises forming a layer of Ru or Ir.

16. A magnetic memory, comprising:
a first storage stack including a first data storage layer defining a first plane and adapted to store bits of data, wherein the first data storage layer is formed from a multi-layer structure exhibiting an antiparallel coupling state at ambient temperatures;
a second storage stack proximate to the first storage stack, wherein the second storage stack includes a second data storage layer defining a second plane that is parallel to the first plane and is adapted to store bits of data, and wherein the second data storage layer is formed from a multi-layer structure exhibiting an antiparallel coupling state at the ambient temperatures; and
a third storage stack proximate to the second storage stack, wherein the third storage stack includes a third data storage layer defining a third plane that is parallel to the first and second planes and is adapted to store bits of data, and wherein the third data storage layer is formed from a multi-layer structure exhibiting an antiparallel coupling state at the ambient temperatures.

17. The magnetic memory of claim 16 wherein the multi-layer structure of the first data storage layer includes:
a first ferromagnetic layer;
an antiparallel coupling layer formed on the first ferromagnetic layer;
a second ferromagnetic layer formed on the antiparallel coupling layer; and
a third ferromagnetic layer formed on the second ferromagnetic layer;
wherein the first ferromagnetic layer and the third ferromagnetic layer of the multi-layer structure have a Curie temperature that is higher than the Curie temperature of the second ferromagnetic layer.

* * * * *